United States Patent
Motte et al.

(10) Patent No.: US 6,852,373 B1
(45) Date of Patent: Feb. 8, 2005

(54) METHOD FOR DEPOSITING A SILICON-CONTAINING DIELECTRIC MATERIAL ON COPPER

(75) Inventors: Pascale Motte, Grenoble (FR); Joaquim Torres, Vinoux (FR); Brigitte Descouts, Meylan (FR); Jean Palleau, Theys (FR)

(73) Assignees: Commissariat a l'Energie Atomique, Paris (FR); STMicroelectronics SA, Gentilly (FR)

( * ) Notice: Subject to any disclaimer, the term of this patent is extended or adjusted under 35 U.S.C. 154(b) by 183 days.

(21) Appl. No.: 09/786,059
(22) PCT Filed: Jul. 3, 2000
(86) PCT No.: PCT/FR00/01891
§ 371 (c)(1),
(2), (4) Date: Jun. 13, 2001
(87) PCT Pub. No.: WO01/99113
PCT Pub. Date: Jun. 18, 2001

(30) Foreign Application Priority Data

Jul. 1, 1999 (FR) .......................... 99 08474

(51) Int. Cl.$^7$ ............................. C23C 16/40
(52) U.S. Cl. .................. 427/579; 427/99; 427/255.29; 427/255.37
(58) Field of Search .............. 427/579, 99, 255.29, 427/255.37, 255.28, 255.394, 574

(56) References Cited

U.S. PATENT DOCUMENTS

| | | | | |
|---|---|---|---|---|
| 4,910,043 A | * | 3/1990 | Freeman et al. | 427/572 |
| 5,831,283 A | * | 11/1998 | Batey et al. | 257/66 |
| 6,043,167 A | * | 3/2000 | Lee et al. | 438/789 |
| 6,077,574 A | * | 6/2000 | Usami | 427/579 |
| 6,270,835 B1 | * | 8/2001 | Hunt et al. | 427/79 |
| 6,372,291 B1 | * | 4/2002 | Hua et al. | 427/255.28 |

OTHER PUBLICATIONS

Patent Abstracts of Japan, JP 6–244181, Sep. 2, 1994.
Patent Abstracts of Japan, JP 4–350937, Dec. 4, 1992.
Derwent Abstracts, JP 11–026465, Jan. 29, 1999.

* cited by examiner

*Primary Examiner*—Bret Chen
(74) *Attorney, Agent, or Firm*—Oblon, Spivak, McClelland, Maier & Neustadt, P.C.

(57) ABSTRACT

A method for depositing a dielectric material on copper apparent on the surface of a structure, by placing the structure in a depositing chamber of CVD type (Chemical Vapor Deposition), adding to the chamber a first gas forming a precursor for the formation of the dielectric material and containing an element able to contaminate copper, adding to the chamber a second gas containing a chemical element intended, together with the element contained in the first gas and able to contaminate copper, to form said dielectric material, the second gas being able to react with the first gas to give the deposit of dielectric material, performing the deposit of dielectric material from the first gas and the second gas, characterized in that the method comprises a step for adding a third gas able to prevent the contamination of copper by said element contained in the first gas.

17 Claims, 1 Drawing Sheet

METHOD FOR DEPOSITING A SILICON-CONTAINING DIELECTRIC MATERIAL ON COPPER

TECHNICAL FIELD

Figure 1:
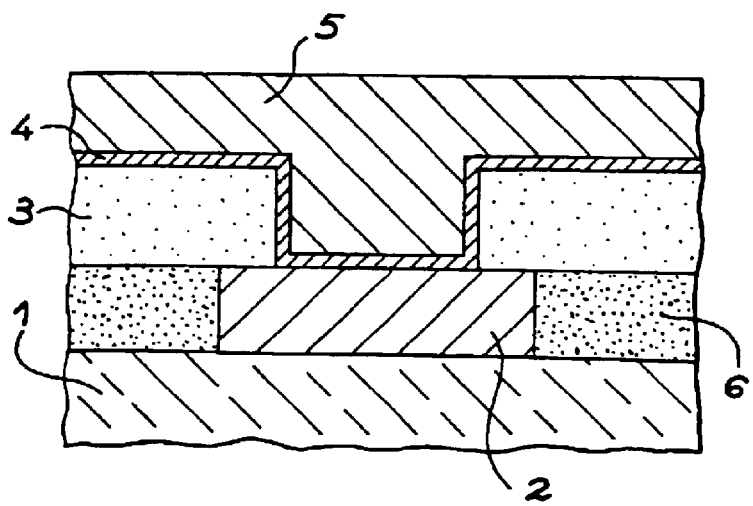

The present invention relates to a method for depositing a silicon-containing dielectric material on copper. It particularly concerns a method for depositing a copper-diffusion barrier layer, containing silicon, on copper conductor lines. This method is especially suitable for producing copper interconnection layers on semiconductor devices.

PRIOR ART

In production techniques for microelectronic devices, copper is increasingly used in the fabrication of interconnections due to its electric properties and in particular to its very low resistivity. By replacing aluminium it can improve the performances of integrated circuits of microprocessor type.

For devices fabricated from a silicon substrate, the insulating materials used between the interconnection lines and between the interconnection levels contain silicon. These are $SiO_2$, SiN and SiON in particular.

The essential difficulty connected with the use of copper in such devices lies in the fact that a contamination by the copper of the active parts of the substrate (transistors for example) at very low levels (in the order of a few $10^{11}$ atoms/cm$^3$) is sufficient to fully degrade the performances of the corresponding circuits. Any diffusion of the copper towards the active parts must therefore be avoided. For this purpose, diffusion barrier layers in dielectric material are known to be deposited between the copper and the active parts. Some barrier layers are deposited directly on the copper. The adhesion of the barrier layer material to the copper must also be of good quality to enable the fabrication of interconnections at several levels. The best dielectric materials for producing a copper-diffusion barrier layer are compounds containing silicon and nitrogen, of $SIN_x$ type.

Materials of $SiN_x$ type may be deposited at relatively low temperature by methods of CVD type (Chemical Vapour Deposition) using gas mixtures in variable proportions of silane, nitrogen and ammonia.

The rate of deposit is accelerated by using a plasma to decompose the reactive species.

The copper may then in turn be contaminated by the material of the barrier layer on account of the method of deposit used. The result is a very marked change in the resistivity of the copper lines. This increase in resistivity is greater the higher the temperature at which the depositing operation is conducted. This is the case in particular for inter-level deposits on copper.

The increase in copper resistivity can be accounted for by the rapid diffusion of silicon from the material of the barrier layer into the copper. A contamination formed of only 1% silicon in solution in the copper leads to a twofold increase in the copper's resistivity, which is considerable.

Other layers of dielectric material may be deposited on the copper using precursors containing chemical elements able to contaminate copper. In addition to silicon, fluorine and carbon may be cited.

To deposit a dielectric containing silicon, silane, dimethylsilane or trimethylsilane may be used. Possible contamination of the copper by fluorine may be made by using a $CF_x/CH_x$ mixture as precursor.

When silicon nitride is deposited on copper, the formation of a silicide on the copper has been found and used to improve the adhesion of the nitride layer to the copper. U.S. Pat. No. 5,447,887, which uses this effect, only mentions the deterioration of the surface resistivity of the copper layer: the formation of copper silicide leads to a copper consumption of less than 10% of the initial layer. However, the effect on the resistivity through the silicon being placed in solution in the remainder of the copper layer is not approached. Moreover, this method for improving the adhesion of the nitride to the copper requires the consumption of part of the initial copper layer, which limits its application to layers of relatively substantial thickness (at least 1 μm).

U.S. Pat. No. 5,831,283 teaches that the adhesion of the SiN dielectric to copper may be obtained by depositing dense SiN at low temperature and without ammonia. The formation of a silicide is not mentioned as vector of adhesion. However, the rate of the nitride deposit is too slow (26 nm/min at 200° C.) which penalises productivity. This patent does not refer to any possible degradation of the resistivity of the copper underlying the nitride layer.

DESCRIPTION OF THE INVENTION

To remedy the disadvantages listed above, the present invention puts forward a method for depositing dielectric material on copper, this method making it possible to prevent the contamination of the copper by a contaminating element derived from a gas used to make this deposit of dielectric material, and with which it is also possible to obtain a good quality interface between the copper and the deposited dielectric material.

The subject of the invention is therefore a method for depositing a dielectric material on copper apparent on the surface of a structure, which entails the following steps:

placing the structure in a depositing chamber of CVD type (chemical vapour deposition), adding to the chamber a first gas forming a precursor for the formation of the dielectric material and containing an element able to contaminate copper, adding to the chamber a second gas containing a chemical element intended, together with the element contained in the first gas and able to contaminate copper, to form said dielectric material, the second gas being able to react with the first gas to give the deposit of dielectric material, making the deposit of dielectric material from the first gas and the second gas, characterized in that the method comprises a step for adding a third gas able to prevent contamination of the copper by said element contained in the first gas.

Advantageously, the deposit chamber permitting plasma assisted chemical vapour deposition (PECVD), the method comprises a plasma lighting step to conduct the deposit of dielectric material from the first gas and the second gas.

The first gas may be silane. The second gas may contain a chemical element which is nitrogen or it may itself be nitrogen. The third gas may contain oxygen and/or nitrogen and/or carbon. It may be chosen from the group made up of $N_xO_y$, $C_xH_y$, a $xN_2+yH_2$ mixture or a $xO_2+yN_2$ mixture. By way of example, it may be formed of $NH_3$, $N_2O$, $CH_4$ and $C_2H_6$.

According to one variant of embodiment, the first, second and third gases are also added before lighting of the plasma, the flow rates of the first, second and third gases, the energy needed for deposit and the time of formation of the deposit being adjusted in relation to the thickness of the desired dielectric material and its desired physical properties (optical, density, stress, dielectric constant).

According to another variant of embodiment, the steps are conducted in the following order:

placing the structure in the deposit chamber, adding the third gas to the deposit chamber, the third gas being chosen to reduce the oxides present on the copper surface, lighting a third gas plasma in the deposit chamber in order to reduce said oxides, adding the first and second gases to the deposit chamber, adjusting the flow rates of the first, second and third gases, the energy needed for the deposit, and the time of formation of the deposit in relation to the thickness of the desired dielectric material and its desired physical properties.

The third gas may advantageously be ammonia.

To obtain a dielectric material in SiN, the first gas may be silane, the chemical element of the second gas may be nitrogen and the third gas may be ammonia.

The formation of the dielectric material may be made under a temperature of between 100 and 600° C., preferably under a temperature in the region of 400° C.

Optionally, the third gas may be the same as the second gas. It may also be a mixture. For example, it may be diluted in a neutral gas such as nitrogen, argon or helium.

A further subject of the invention is the application of this method to the depositing of a copper-diffusion barrier layer on the surface of a structure comprising at least one conductor line in copper.

Yet a further subject of the invention is the application of this method to the depositing of barrier layers against the diffusion of copper at the time of fabricating interconnection levels in copper on semiconductor devices.

SHORT DESCRIPTION OF THE DRAWINGS

Figure 2:
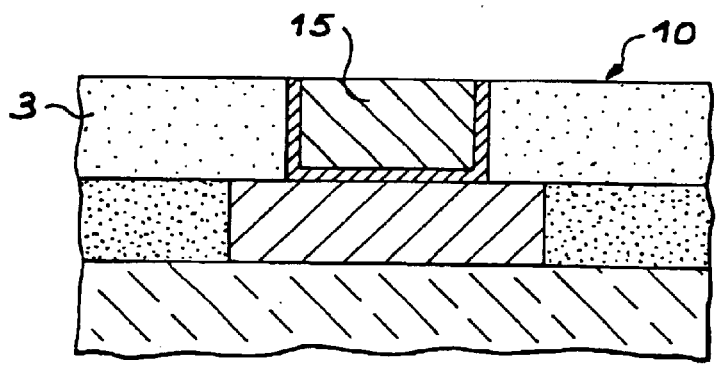
Figure 3:
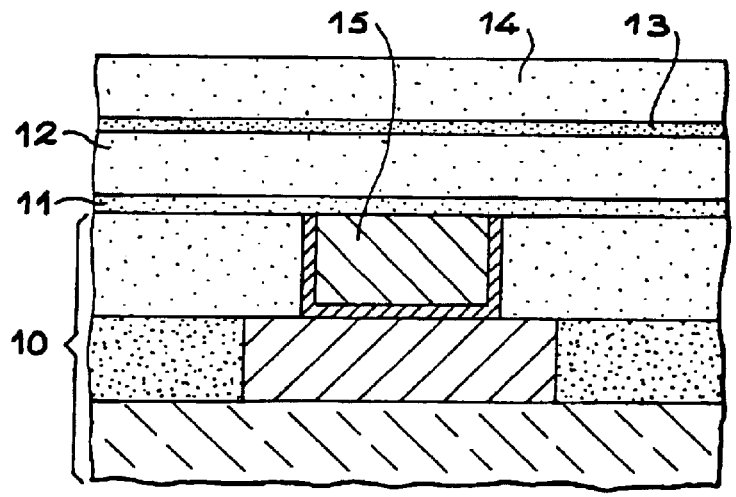

The invention will be better understood and other advantages and particular features will become apparent on reading the following description that is given by way of example and is non-restrictive, accompanied by the appended drawings among which:

FIG. 1 illustrates the copper plating deposition step in the fabrication of an interconnection level of damascene type, FIG. 2 illustrates the mechanical-chemical polishing step in the fabrication of the interconnection level of damascene type, FIG. 3 shows the interconnection level after the depositing of different layers of dielectric material.

DETAILED DESCRIPTION OF EMBODIMENTS OF THE INVENTION

FIG. 1 shows part of a substrate in silicon 1 comprising an electric contact 2 to be connected to an electric line in copper. The electric contact 2 is laterally surrounded by a dielectric material 6, in $SiO_2$ for example. In known manner, a layer of dielectric material 3, in $SiO_2$ for example, is deposited on the free surface of the structure. Layer 3 is etched such as to expose part of contact 2. A layer 4 in TiN is deposited on the etched layer 3. Layer 4 prevents the diffusion of copper into the dielectric and into the substrate in silicon 1. Plating 5 in copper is then uniformly deposited on layer 4. This plating ensures the electric connection with contact 2 and extends to above the layer of dielectric material 3.

FIG. 2 shows the structure 10 obtained after the mechanical-chemical polishing stage which is continued until the layer of dielectric material 3 is reached and the layer of TiN above layer 3 is removed. After the polishing step, the polished surface of structure 10 is cleaned. It shows an apparent copper mass 15.

FIG. 3 shows the interconnection level that is subsequently made. It is an interconnection level of double damascene type. It comprises a layer 11 of SiN deposited on the surface of structure 10, a layer 12 of $SiO_2$ covering layer 11, a layer 13 of SiN covering layer 12 and a layer 14 of $SiO_2$ covering layer 13.

Layers 11 to 14 may be deposited at a temperature of 400° C.

Layer 11 in SiN, according to the depositing method disclosed in document U.S. Pat. No. 5,831,283, was deposited in the following manner. Gases $N_2$ and $SiH_4$ are mixed for 10 seconds in a PECVD depositing chamber. A first deposit is made at 500 W with this mixture. A second deposit is then made at 625 W at the start of which the gas $NH_3$ is added. This method of the prior art induces an increase of 40% in the surface resistance of the copper over a thickness of 200 nm.

According to the invention, the increase in the surface resistance of the copper is prevented by adding the $NH_3$ gas before adding the $SiH_4$ and $N_2$ gases in the described example and before lighting the deposit plasma. The nitrogen enables homogenisation of the temperature and the gas phase. The first deposit of the method according to document U.S. Pat. No. 5,831,283 is eliminated.

It was found that with the method of the invention, a good quality SiN/Cu interface is obtained: the nitride shows no abnormal roughness and no delamination. The properties of the SiN layer are identical to those of the method according to the prior art. Above all, no increase in the surface resistance of the copper is observed, that is to say that if there is an increase in resistance, it is less than 1%.

A variant of embodiment of the method will be described below. With this variant it is possible to ensure good reproducibility of the Cu/SiN interface by means of a treatment with $NH_3$ plasma on the copper surface. This treatment leads to reducing the oxides formed on the surface of the copper.

In this case, in order to prevent reaction of the silane on the copper surface activated by the plasma of $NH_3$, and in order to prevent contamination of the copper by the silicon, the SiN deposit must be made as a continuation of the $NH_3$ plasma treatment. Once the plasma has been lighted with the $NH_3$ gas and the deoxidation treatment completed, the silane and nitrogen gases are added and the ammonia flow rate is modified to obtain the necessary proportions of gases for the depositing of silicon nitride. The $NH_3$ plasma is made at the same temperature as the nitride deposit. The power of the $NH_3$ plasma may be different to that of the nitride deposit. It only needs to be adjusted without the plasma being interrupted.

A further subject of the invention is a method for depositing a dielectric material on copper apparent on the surface of a structure, entailing the following steps:

placing the structure in a deposit chamber of CVD type (chemical vapour deposition), adding to the chamber a gas forming a precursor for the formation of the dielectric material and containing a first element able to contaminate copper and a second element able to combine with the first element to give the dielectric material, performing the deposit of dielectric material by combining the first element and the second element, characterized in that the method comprises a step for adding an additional gas able to prevent the contamination of the copper by said element contained in the precursor gas.

To obtain a dielectric material in SiC, the gas forming a precursor may be trimethylsilane.

What is claimed is:

1. A method for depositing a dielectric material on copper on the surface of a structure, entailing the following steps:

placing the structure in a deposit chamber of chemical vapor deposition or plasma assisted chemical vapor deposition, adding to the chamber a first gas forming a precursor for the formation of the dielectric material and containing an element able to contaminate copper, adding to the chamber a second gas containing a chemical element intended, together with the element contained in the first gas and able to contaminate copper, to form said dielectric material, the second gas being able to react with the first gas to give a deposit of dielectric material, performing the deposit of dielectric material from the first gas and the second gas, the method also comprising a step for adding a third gas able to prevent the contamination of copper by said element contained in the first gas in which the third gas comprises at least one member selected from the group consisting of oxygen, nitrogen, and carbon and the third gas is present during the adding of the first and second gases.

2. The method according to claim 1, in which the deposit chamber permitting plasma assisted Chemical Vapour Deposition (PECVD), the method comprises a step for lighting the plasma to make the deposit of dielectric material from the first gas and the second gas.

3. The method according to claim 2, in which the steps are conducted in the following order:

placing the structure in the deposit chamber, adding the third gas to the deposit chamber, the third gas being chosen to reduce oxides present on the surface of the copper in which the third gas comprises at least one member selected from the group consisting of oxygen, nitrogen, and carbon and the third gas is present during the adding of the first and second gases, lighting a plasma of third gas in the deposit chamber in order to reduce said oxides, adding the first and second gases to the deposit chamber, adjustment of the flow rates of the first, second and third gases, of the energy required for the deposit and the formation time of the deposit in relation to the desired thickness of the dielectric material and its desired physical properties.

4. The method according to claim 3, in which the third gas further comprises ammonia.

5. The method according to claim 1, in which the first gas is silane, the contaminating element being Si.

6. The method according claim 1, in which said chemical element of the second gas is nitrogen.

7. The method according to claim 1, in which the second gas is nitrogen.

8. The method according to claim 1, in which the third gas is at least one member selected from the group consisting of $N_xO_y$, $C_xH_y$, $xN_2+yH_2$ mixture, and $xO_2+yN_2$ mixture.

9. The method according to claim 1, in which the third gas is at least one member selected from the group of $NH_3$, $N_2O$, $CH_4$ and $C_2H_6$.

10. The method according to claim 1, in which the first, second and third gases are also added before lighting of the plasma, the flow rates of the first, second and third gases, the energy required for depositing and the time of formation of the deposit being adjusted in relation to the desired thickness of the dielectric material.

11. The method according to claim 1, in which for the purpose of obtaining a dielectric material in SiN, the first gas is silane, said chemical element of the second gas is nitrogen and the third gas further comprises ammonia.

12. The method according to claim 1, in which the formation of the dielectric material is made under a temperature of between 100 and 600° C.

13. A method for depositing a dielectric material on copper on the surface of a structure, entailing the following steps:

placing the structure in a deposit chamber of chemical vapor deposition or plasma assisted chemical vapor deposition, adding to the chamber a gas forming a precursor for the formation of the dielectric material and containing a first element able to contaminate copper and a second element able to combine with the first element to give the dielectric material, making the deposit of dielectric material by combining the first element and the second element, the method also comprising a step for adding an additional gas able to prevent the contamination of the copper by said element contained in the precursor gas in which the additional gas comprises at least one member selected from the group consisting of oxygen, nitrogen, and carbon and the additional gas is present during the adding of the gas containing the first and second elements.

14. The method according to claim 13, in which the deposit chamber permitting plasma assisted Chemical Vapour Deposition (PECVD), the method comprises a plasma lighting stage to make the deposit of dielectric material from the precursor gas.

15. The method according to claim 13, in which in order to obtain a dielectric material in SiC said gas forming a precursor is trimethylsilane.

16. The method according to claim 1, wherein the structure comprises at least one conductor line in copper.

17. The method according to claim 1, further comprising fabricating interconnection levels in copper on semiconductor devices.

* * * * *